US007053422B2

(12) United States Patent
Ando et al.

(10) Patent No.: US 7,053,422 B2
(45) Date of Patent: May 30, 2006

(54) SOLID-STATE SELF-EMISSION DISPLAY AND ITS PRODUCTION METHOD

(75) Inventors: Masahiko Ando, Ibaraki (JP); Toshikazu Shimada, Tokyo (JP); Masatoshi Shiiki, Tokyo (JP); Shunri Oda, Tokyo (JP); Nobuyoshi Koshida, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 138 days.

(21) Appl. No.: 10/490,660

(22) PCT Filed: Sep. 30, 2002

(86) PCT No.: PCT/JP02/10190

§ 371 (c)(1),
(2), (4) Date: Mar. 25, 2004

(87) PCT Pub. No.: WO03/032690

PCT Pub. Date: Apr. 17, 2003

(65) Prior Publication Data

US 2004/0246408 A1 Dec. 9, 2004

(30) Foreign Application Priority Data

Oct. 1, 2001 (JP) ............................ 2001-305857

(51) Int. Cl.
*H01L 33/00* (2006.01)

(52) U.S. Cl. .......................... 257/103; 257/80; 257/87; 257/101; 257/102; 257/428; 977/DIG. 1; 438/782; 438/800

(58) Field of Classification Search ........... 977/DIG. 1
See application file for complete search history.

(56) References Cited

U.S. PATENT DOCUMENTS

| | | | | |
|---|---|---|---|---|
| 5,229,628 A * | 7/1993 | Kobayashi et al. | ......... | 257/103 |
| 6,143,201 A * | 11/2000 | Mano | .................. | 252/301.6 S |

FOREIGN PATENT DOCUMENTS

| | | |
|---|---|---|
| JP | 05-206515 | 8/1993 |
| JP | 09-7499 | 1/1997 |
| JP | 09-92167 | 4/1997 |
| JP | 2000-265166 | 9/2000 |
| WO | WO 01/91155 | 11/2001 |

* cited by examiner

OTHER PUBLICATIONS

Notification of Transmittal of Copies of Translation of the International Preliminary Examination Report dated Jul. 1, 2004 and received by our foreign associate on Jul. 6, 2004.

*Primary Examiner*—Andy Huynh
(74) *Attorney, Agent, or Firm*—Westerman, Hattori, Daniels & Adrian, LLP

(57) ABSTRACT

The present invention provides a solid state light-emissive display apparatus of high brightness and efficiency, high reliability, and of thin type, and method of manufacturing the same at low cost.

Said apparatus has the luminous thin film made up by laminating or mixing crystal fine particle coated with insulator (5) of nm size and fluorescent fine particles (7) of nm size, and the lower electrode and the transparent upper electrode sandwiching said luminous thin film, wherein the electrons injected from said lower electrode are accelerated in the crystal fine particle coated with insulator layer (6) not being scattered by phonons to become high energy ballistic electrons, and form excitons (13) by colliding excitation of fluorescent fine particles. Since said fluorescent fine particles are of nm size, the exciton concentration is high, and luminescence intensity by extinction of excitons is also high.

16 Claims, 6 Drawing Sheets

(a)

(b)

SOLID-STATE SELF-EMISSION DISPLAY AND ITS PRODUCTION METHOD

TECHNICAL FIELD

The present invention relates to solid state light-emissive display apparatus utilizing a quantum size effect and method of manufacturing the same.

BACKGROUND ART

The display apparatuses using liquid crystals are lately in wide spread use, but these are not the best in such properties as energy-saving or brightness, since a liquid crystal display apparatus uses backlight in principle. For this reason, the research and development are widely proceeding for a solid state light-emissive display apparatus, aiming to realize high brightness, energy-saving, flat type, and high reliability rather more than liquid crystal.

As an existing solid state light-emissive display apparatus, there is EL(Electro Luminescence) display apparatus. EL display apparatus is composed of pixels each of which has a semiconductor layer including light emission center atoms and insulator layers sandwiching said semiconductor layer. As a light emission center atom, such elements that emit visible fluorescence, for example, Mn or rare earth elements are used, and as a semiconductor layer, such semiconductors that have larger band gap energy than visible light, for example, ZnS or else are used, and as insulator layers, such insulators that have a property which prevents dielectric breakdown of said semiconductor layers, for example, thin films of $SiO_2$ or $Si_3N_4$ are used.

EL display apparatus emits light as following, electrons in a semiconductor are accelerated by high electric field imposed through insulation layers, the accelerated electrons collide to light emission center atoms to be excited, and the excited light emission center atoms emit fluorescence light. Therefore it is the specific feature of EL display apparatus that electric energy directly converts to light energy.

However, there are problems such that light emission efficiency is low and dielectric breakdown tends to occur, because considerably high electric field ($10^6$ V/cm or higher) is necessary to accelerate the electrons to such a high energy state (hot electron state) to emit EL light against the energy dispersion by phonon scattering. There are also such EL display apparatuses using organic materials as the semiconductor layer, but they also have problems such that emission efficiency easily becomes lower as organic materials are unstable and readily deteriorate.

There are also FED (Field Emission Device) display apparatuses as the display apparatuses to generate fluorescence by colliding and exciting light emission center atoms by accelerated electron (ballistic electron). However, an FED display apparatus has its problems such that, though it can emit light at relatively low electric field, it requires vacuum space and hence it can not be made to a flat and all-solid state type, since it emits out electrons into vacuum by using a field-emission type electron gun and accelerates them in vacuum.

DISCLOSURE OF THE INVENTION

Taking into consideration the afore-mentioned problems, the object of the present invention is to provide a solid state light-emissive display apparatus which has much superior properties to existing display apparatuses in brightness, efficiency, reliability, and a thin type. And also the other object of the present invention is to provide a method of manufacturing the said apparatus, which manufactures it at low cost.

In order to achieve the object mentioned above, there is provided a solid state light-emissive display apparatus according to the present invention, characterized in that it has light emitting pixels comprising of a luminous thin film composed of crystal fine particles of nm(nanometer) size coated with insulator and fluorescent fine particles of nm size in a form of laminating of two said each particle layers or in a form of mixed layer of said two particles, and a lower electrode and a transparent upper electrode sandwiching said luminous thin film, whereby to obtain luminous display by impressing alternating voltage or direct current voltage between said upper and lower electrodes.

In the solid state light-emissive display apparatus according to the present invention, said crystal fine particle of nm size coated with insulator is characterized in that it consists of a semiconductor or a metal single crystal fine particle of nm size and insulator film of nm thickness coating the surface of said single crystal fine particle.

In the solid state light-emissive display apparatus according to the present invention, said crystal fine particle of nm is preferably an intrinsic or impurity doped Si single crystal fine particle of nm size, and said insulator film is a $SiO_2$ film of nm thickness coating the surface of said Si single crystal fine particle.

Also preferably, said fluorescent fine particle of nm size is a semiconductor fine particle having a band gap energy corresponding to an energy ranging from ultraviolet light to visible light. Said fluorescent fine particle of nm size may have a donor or/and an acceptor. Also said fluorescent fine particle of nm size may be a semiconductor fine particle involving luminous atoms or luminous atom ions.

According to the above mentioned makeup, the voltage impressed between the lower and the upper electrodes is distributed to the insulator films coating the crystal fine particles of nm size in the luminous thin film, the electrons injected from the lower electrode are accelerated by the electric field distributed to the insulator film, pass through said insulator film by tunneling or resonant tunneling, and pass through the single crystal fine particle of nm size without being scattered by phonons (Refer to JP 2001-332168, for example). The electrons repeat the above mentioned process for each adjacent crystal fine particle of nm size coated with insulator as a result to obtain high kinetic energy, and collide with the fluorescent fine particles of nm size. If the kinetic energy of the colliding electron is higher than the band gap energy of the fluorescent fine particle, a free electron and a hole are generated in the fluorescent fine particle, and a free exciton is generated from these free electron and hole.

Since the fluorescent fine particle is of nm size, said electron and hole are enclosed in space of nm size, the concentration of said free exciton is raised, and hence the luminous intensity by extinction of said free excitons is increased.

Also, in case that the fluorescent fine particle has a donor or/and an acceptor, the generated electron and hole form a bound exciton via a donor or/and an acceptor. Since the fluorescent fine particle is of nm size, the electron and the hole are enclosed in space of nm size, hence the concentration of bound exciton is raised, and the luminous intensity by extinction of said bound excitons is increased.

Also, in the case of fluorescent fine particle including luminous atoms or luminous atom ions, since the electrons having high kinetic energy are generated in large quantity by crystal fine particles coated with insulator, luminous atoms or luminous atom ions in fluorescent fine particles are excited in large quantity, and luminous intensity is increased.

Thus, according to the present invention, since electrons can be accelerated without energy loss and exciton concentration can be high, the luminous efficiency and brightness are high. Also, since the luminous thin film is thin and can emit light by itself, the apparatus of this invention can be made extremely thin. Also, since the applied voltage is low, reliability is high.

And, the solid state light-emissive display apparatus according to the present invention is characterized in that the upper and the lower electrodes are configurated in a form of matrix configuration, and the intersected region of the upper and the lower electrode is used as a light emitting pixel by simple matrix driven with these electrodes.

According to the makeup mentioned above, an image display apparatus of high efficiency, high brightness, thin type, and high reliability can be provided.

Further, the solid state light-emissive display apparatus of the present invention is characterized in that wirings for scanning and wirings for signals are provided in a form of matrix electrode configuration, a thin film transistor is provided at each intersection of said scanning and signal wirings, the gate electrode of said thin film transistor is connected to scanning wiring, the drain electrode of said thin film transistor is connected to signal wiring, the source electrode of said thin film transistor is connected to an electrode of a light emitting pixel, a luminous thin film is sandwiched by said electrode and upper electrode of said light emitting pixel, wherein each light emitting pixel can be actively driven by said each thin film transistor selected by said scanning and signal wirings.

According to the makeup mentioned above, since the optical distinction ratio between adjacent pixels can be made high, an image display apparatus of high efficiency, high brightness, thin type, and high reliability, and extremely high resolution can be provided.

Next, in order to achieve the other object mentioned above, there is provided in accordance with the present invention a method of manufacturing the solid state light-emissive apparatus characterized in that it comprises the steps of: forming Si single crystal fine particles of nm size being floating in an atmosphere by pyrolyzing $SiH_4$ gas, and conveying said floating Si single crystal fine particles into $O_2$ gas atmosphere, whereby the surface of said Si single crystal fine particles to be coated with $SiO_2$ film of nm thickness.

According to the makeup described above, since the Si single crystal fine particles are formed in a state of floating and $SiO_2$ film is formed on the surface of said floating Si single crystal fine particles in a state of floating, Si single crystal fine particles do not contact mutually not to be combined with each other, and hence mutually isolated Si single crystal fine particles coated with $SiO_2$ film can be provided.

By using above mentioned particles, a solid state light-emissive apparatus can be manufactured by dissolving the crystal fine particles of nm size coated with insulator and the fluorescent fine particles of nm size into respective solvents, soaking a substrate and then taking it out in turn with respective solvents, whereby to laminate the layers of the crystal fine particle of nm size coated with insulator and the layers of fluorescent fine particle of nm size.

According to the makeup above mentioned, a mono-layer which consists of the crystal fine particles coated with insulator being densely aggregated on the substrate, is obtained by one time processing of soaking a substrate into the solvent dissolving the crystal fine particles of nm size coated with insulator and taking out there-from, and the desired thickness of the layer is obtained by repeating the above processing. Then, a mono-layer which consists of the fluorescent fine particles of nm size being densely aligned on the layer of the crystal fine particles of nm size coated with insulator on the substrate, is obtained by one time processing of soaking the substrate into the solvent dissolving fluorescent fine particles of nm size and taking out there-from, and the desired thickness of the layer is obtained by repeating the above processing. As the result, the luminous thin film can be provided, in which the crystal fine particle layer of the desired film thickness and the fluorescent fine particle layer of the desired film thickness are laminated.

According to the above mentioned method, since those fine particles can be densely packed with only a few gaps between those fine particles in the luminous thin film, it can emit light at high efficiency. And, since no expensive apparatus is needed for the manufacturing, it costs are low.

And the luminous thin film of the solid state light-emissive apparatus according to the present invention can be also manufactured by dissolving the crystal fine particles of nm size coated with insulator and the fluorescent fine particles of nm size into common solvent, by soaking a substrate into the solvent and then taking it out from the solvent, whereby to make a mixed layer of the crystal fine particles of nm size coated with insulator and the fluorescent fine particles of nm size.

According to the above mentioned makeup, a mono layer which consists of the crystal fine particles coated with insulator and the fluorescent fine particles of nm size being densely and mutually aligned on the substrate, is obtained by one time processing of soaking a substrate into the solvent and taking it out there-from, and the desired thickness of the layer is obtained by repeating the above processing.

According to the above mentioned method, since those fine particles can be densely packed with only a few gaps between those fine particles in the luminous thin film, it can emit light at high efficiency. And, since no expensive apparatus is needed for the manufacturing, costs are low. The afore mentioned crystal fine particles of nm size coated with insulator preferably consists of a single crystal fine particle of a semiconductor or a metal of nm size coated with insulator film of nm thickness.

Also, the single crystal fine particle of nm size is preferably an intrinsic or impurity-doped Si single crystal fine particle of nm size, and the insulator film is preferably a $SiO_2$ film of nm thickness.

Said fluorescent fine particle of nm size may be a semiconductor fine particle having a band gap energy corresponding to an energy ranging from ultraviolet light to visible light. Also, a fluorescent fine particle of nm size may have a donor or/and an acceptor. Still further, a fluorescent fine particle of nm size may be a semiconductor fine particle involving luminous atoms or luminous atom ions.

BRIEF DESCRIPTION OF THE DRAWINGS

The present invention will better be understood from the following detailed description and the drawings attached hereto showing certain illustrative forms of embodiment of the present invention; in this connection, it should be noted that such forms of embodiment illustrated in the accompanying drawings hereof are intended in no way to limit the present invention but to facilitate an explanation and an understanding thereof, in which drawings.

BEST MODES FOR CARRYING OUT THE INVENTION

Figure 1:
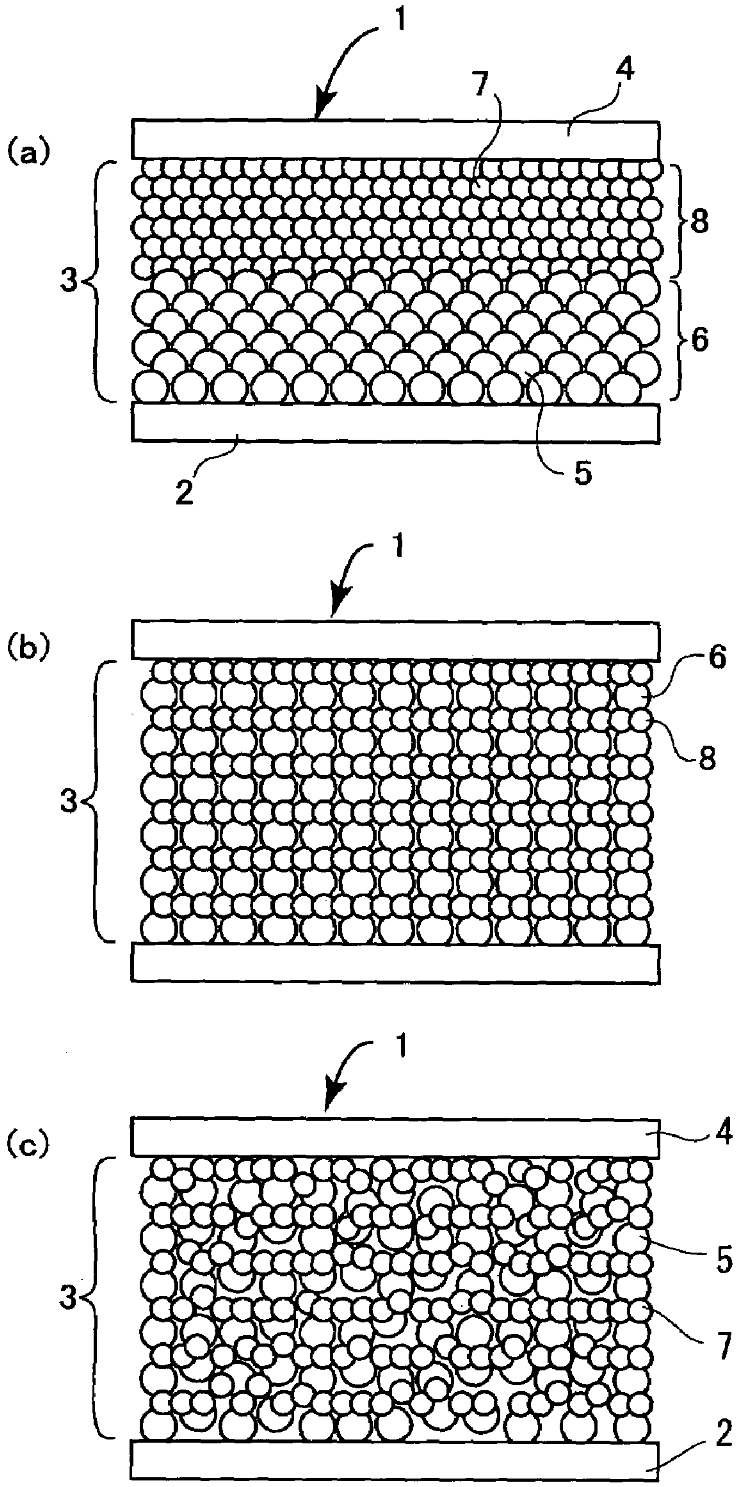
FIG. 1 is a diagrammatic cross-sectional view showing the makeup of a solid state light-emissive display apparatus of the present invention, wherein (a) is a drawing showing the makeup of double layer lamination of a layer composed of crystal fine particles coated with insulator and a layer composed of fluorescent fine particles, (b) is a drawing showing the makeup of alternate lamination of each one layer composed of crystal fine particles coated with insulator and composed of fluorescent fine particles, and (c) is a drawing showing the makeup of lamination of a mixed layer composed of crystal fine particles coated with insulator and fluorescent fine particles.

Hereinafter, a detailed explanation is given in respect to embodiment of the present invention, references being made to figures. In the drawing figures, it should be noted that the same reference characters are used to designate substantially the same or corresponding components.

FIG. 1 is a diagrammatic cross-sectional view showing the makeup of a luminous part of a solid state light-emissive display apparatus of the present invention. FIG. 1(*a*) is a drawing showing the makeup of double layer lamination of a layer composed of crystal fine particles coated with insulator layer and a layer composed of fluorescent fine particles layer, FIG. 1(*b*) is a drawing showing the makeup of alternate lamination of each one layer composed of crystal fine particles coated with insulator layer and of fluorescent fine particles, and FIG. 1(*c*) is a drawing showing the makeup of lamination of a mixed layer composed of crystal fine particles coated with insulator layer and fluorescent fine particles.

In FIG. 1, a luminous part 1 consists of a lower electrode 2, a luminous thin film 3 laminated on the lower electrode 2, and a transparent upper electrode 4 formed on the luminous thin film 3. Said luminous thin film 3, in case of FIG. 1(*a*), consists of laminating a layer 6 composed of crystal fine particles coated with insulator and a layer 8 composed of fluorescent fine particles 7. Also in case of FIG. 1(*b*), said luminous thin film 3 consists of alternately laminating of a layer 6 composed of crystal fine particles coated with insulator and a layer 8 composed of fluorescent fine particles 7. Further in case of FIG. 1(*c*), said luminous thin film 3 consists of laminating a mixed layer of crystal fine particles coated with insulators 5 and fluorescent fine particles 7. Said lower electrode 2 is, for example, n-type high conductive Si substrate 2, and said upper electrode 4 is ITO film which is conductive and transparent to visible light.

Figure 2:
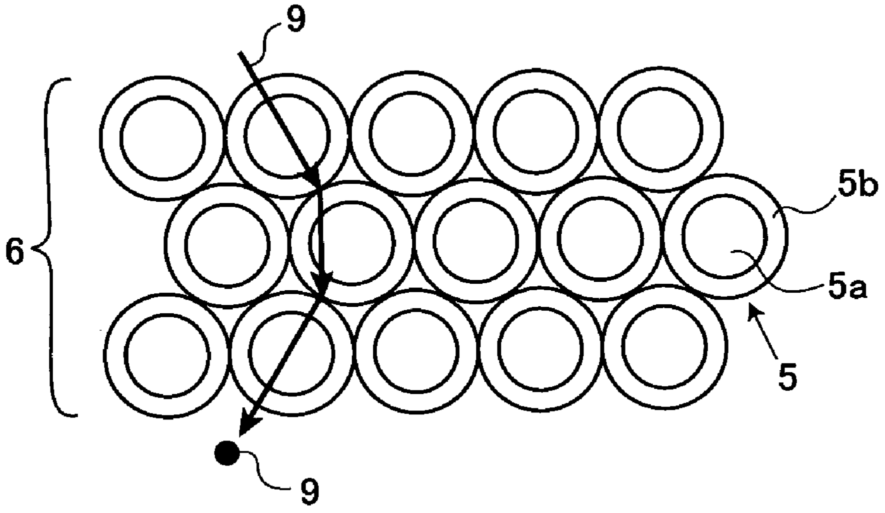
FIG. 2 is a diagrammatic drawing for explanation of operating principle of a solid state light-emissive display apparatus of the present invention, wherein (a) shows an enlarged view of crystal fine particles coated with insulator, and (b) shows an enlarged view of fluorescent fine particles.
Figure 2:
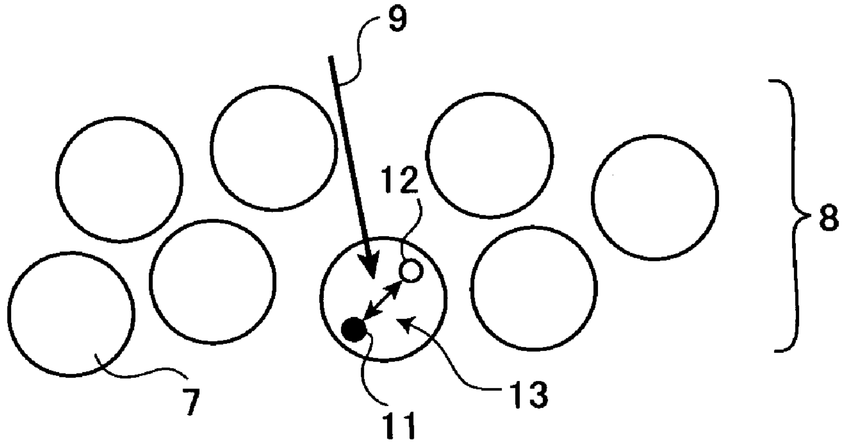

FIG. 2 is a diagrammatic drawing for explanation of operating principle of a solid state light-emissive display apparatus of the present invention, wherein, FIG. 2(*a*) shows an enlarged view of layers of crystal fine particles coated with insulator, and FIG. 2(*b*) shows an enlarged view of layers of fluorescent fine particles.

In FIG. 2(*a*), said layers 6 are constituted as that crystal fine particles coated with insulator 5 are mutually and densely aligned, and this figure shows for an example where crystal fine particle coated with insulators 5 is Si single crystal fine particle of nm size 5*a* coated with $SiO_2$ film of nm thickness 5*b*. Typically in size, the diameter of Si single crystal fine particle 5*a* is 7 nm, and the thickness of the $SiO_2$ film is 3 nm.

In FIG. 2(*b*), said layers 8 are constituted as that fluorescent fine particles 7 are mutually and densely aligned, and said fluorescent fine particle 7 is the semiconductor, for example ZnS, having the band gap energy corresponding to the energy ranging from ultraviolet light to visible light.

An explanation is next made in respect to luminescence mechanism of said luminous part.

Voltage is applied between the lower electrode 2 and the upper electrode 4 so as to be positively high at the upper electrode 4. The voltage is distributed to respective insulators 5*b* of crystal fine particles coated with insulators 5 constituting the layer 6, that is, $SiO_2$ film 5*b* of $SiO_2$ coated Si single crystal fine particles 5. The electrons 9 withdrawn from the lower electrode 2 are accelerated by the electric field distributed to $SiO_2$ films 5*b*, and pass through $SiO_2$ films 5*b* by tunneling or resonant tunneling transporting phenomenon, since the thickness of $SiO_2$ film 5*b* is thin. Since the diameter of a Si single crystal fine particle 5*a* is small, the electrons in Si single crystal fine particles 5*a* pass without being scattered by phonons because of quantum size effect, that is, without loss of kinetic energy. As shown in FIG. 2(*a*), electrons 9 repeat acceleration in $SiO_2$ film 5*b* and lossless passing through Si single crystal fine particle 5*a* at every $SiO_2$ coated Si single crystal fine particle 5, whereby to obtain a kinetic energy sufficient to excite fluorescent fine particles 7 and to emit from layers 6 composed of $SiO_2$ coated Si single crystal fine particles.

As shown in FIG. 2(*b*), the electrons 9 which have obtained the kinetic energy sufficient to excite fluorescent fine particles 7, collide with fluorescent fine particles of nm size 7, and by the collision excitation create free electrons 11 and holes 12 in the conduction band and the valence band of fluorescent fine particles 7. Said electrons 11 and said holes 12 form free excitons 13 by coulomb potential based on the respective electric charges. Since these electrons 11 and holes 12 are enclosed inside the fluorescent fine particle of nm size 7, that is, in the space of nm size, their coulomb interaction is strong, and the formation probability of free exciton 13 increases, whereby the free exciton concentration increases. Since the free exciton concentration is high, luminescence intensity generated by extinction of free excitons 13 increases. Since the free exciton energy depends on the band gap energy of the semiconductor crystal, luminescence wavelength can be chosen by choosing the kind of semiconductor. For example, blue color luminescence can be obtained by using ZnS semiconductor, and red color luminescence can be obtained by using GaAs semiconductor.

Thus, in accordance with the present invention, the generation efficiency of high energy electrons to excite fluorescent fine particles is quite high, and the exciton concentration is also quite high, therefore, high efficiency and high brightness luminescence can be obtained.

Also, since electrons 9 are not scattered by phonons in the process of acceleration, dielectric breakdown of crystal fine particle coated with insulators 5 does not tend to occur. Consequently, since it is possible to make the thickness of fluorescent thin film 3 extremely thin to raise the electric field intensity, a solid state light-emissive display apparatus which is extremely thin type and has high reliability can be obtained.

Also in case that a fluorescent fine particle 7 is doped with a donor or an acceptor, an exciton formed via a donor or an acceptor, namely a bound exciton 13 is formed. In case that a donor and an acceptor are doped, a bound exciton 13 is formed via a donor and an acceptor. In this case, too, since electrons 11 and holes 12 are enclosed inside fluorescent fine particles 7, that is, in the space of nm size, their coulomb interaction is very strong, and the formation probability of bound excitons 13 increases, whereby the bound exciton concentration increases. Since the bound exciton concentration is high in this way, luminescence intensity generated by extinction of bound excitons 13 increases. Also in this case, the luminescence wavelength corresponding to the depth of energy levels of a donor and an acceptor can be obtained. For example, ZnS doped with Al as a donor and Cu as an acceptor provides green light luminescence. Also, by using a semiconductor including luminous atoms or luminous atom ions for fluorescent fine particles 7, the accelerated electrons 9 excite the luminous atoms or luminous atom ions by collision excitation, whereby to generate fluorescence of specific wavelength when the luminous atoms or the luminous atom ions transit from the excited state to the ground state. For example, if Mn is included as luminous atoms in ZnS semiconductor, yellowish orange luminescence can be obtained.

According to the present invention, since electrons 9 can be accelerated at quite high efficiency, fluorescent fine particle layers 8 having luminous center atoms can be made to emit light of high brightness.

As described above, according to the present invention, electrons can be accelerated at quite high efficiency. Theoretically mentioned, since electrons can be accelerated without energy loss, it is possible to obtain luminescence with an applied voltage corresponding to the band gap energy of fluorescent fine particles. For example, if ZnS semiconductor is used as semiconductor of fluorescent fine particles, luminescence is obtained with the applied voltage of about 4V, because the band gap energy of ZnS is about 3.7 eV. Consequently, luminescence of high brightness is possible also by the makeup of FIGS. 1(*b*) and (*c*).

An explanation is next given in respect to a solid state light-emissive display apparatus of the present invention by simple matrix driving.

Figure 3:
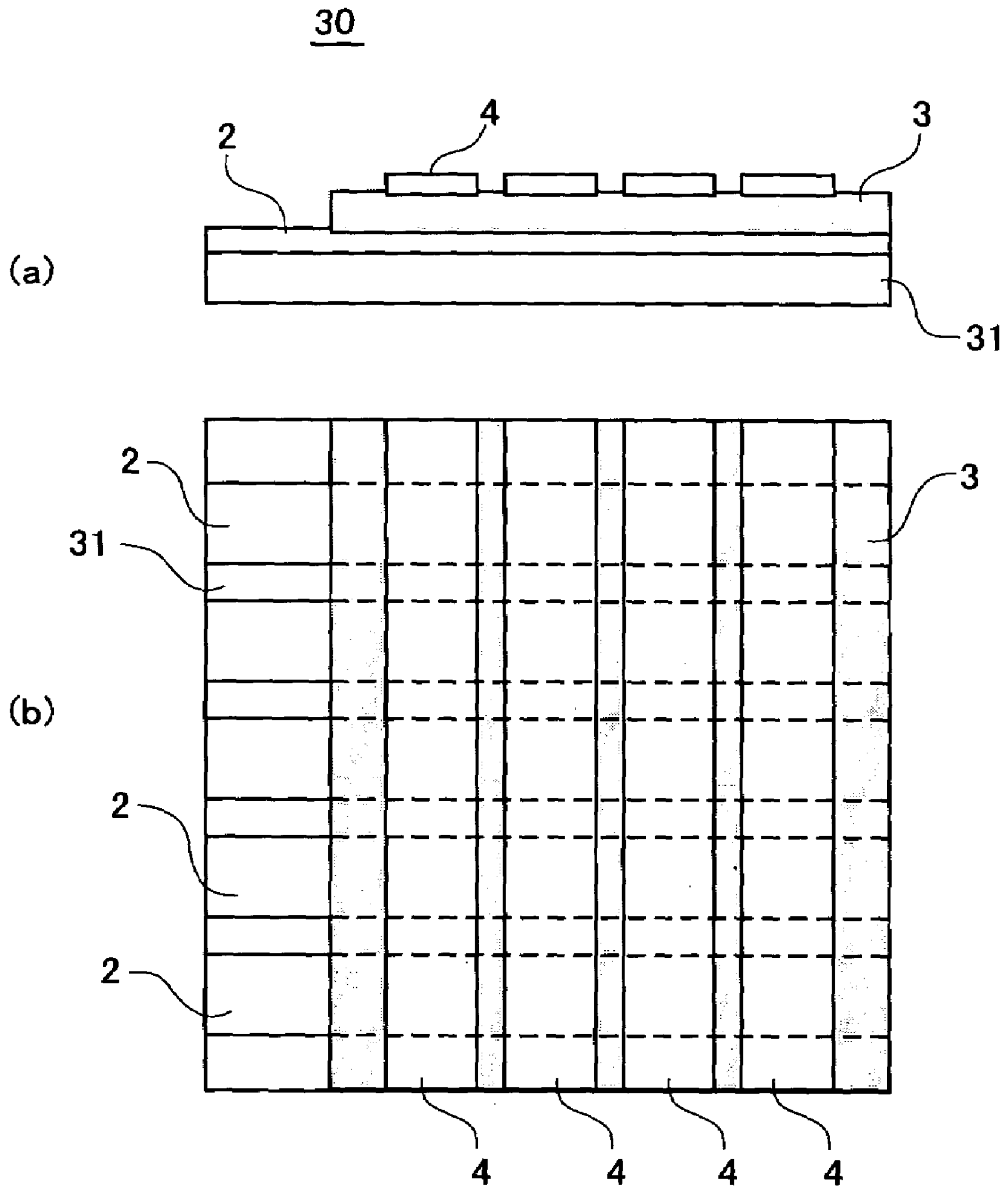
FIG. 3 shows the makeup of a solid state light-emissive display apparatus of the present invention by simple matrix driving, wherein (a) is a cross-sectional view, and (b) is a plan view.

FIG. 3 shows the makeup of a solid state light-emissive display apparatus of the present invention by simple matrix driving, wherein FIG. 3(*a*) is a cross-sectional view, and FIG. 3(*b*) is a plan view. A solid state light-emissive display apparatus 30 comprises a substrate 31, a plurality of the lower electrodes 2 in a form of mutually parallel stripes formed on said substrate 31, luminous thin film 3 laminated on said substrate 31 with the lower electrode 2 formed on the same, a the plurality of the upper electrodes 4 in a form of mutually parallel stripes formed on said luminous thin film 3 so to form a perpendicular matrix with said lower electrode 2. Said upper electrode 4 is made of transparent ITO film.

By making the cross-sectional regions of the lower electrode 2 and the upper electrode 4 as pixels, choosing an arbitrary one set from the plurality of the lower electrodes 2 and the plurality of the upper electrodes 4, and by applying a voltage between the lower electrodes 2 and the upper electrodes 4, the pixels at arbitrary positions are made luminous.

In accordance with the above mentioned, images and mobile images can be displayed. Since the luminous thin film explained in FIG. 1 and FIG. 2 is used, a solid state light-emissive display apparatus 30 of high efficiency and high brightness luminescence, thin type, and high reliability is provided.

An explanation is next given in respect to a solid state light-emissive display apparatus of the present invention by active driving.

Figure 4:
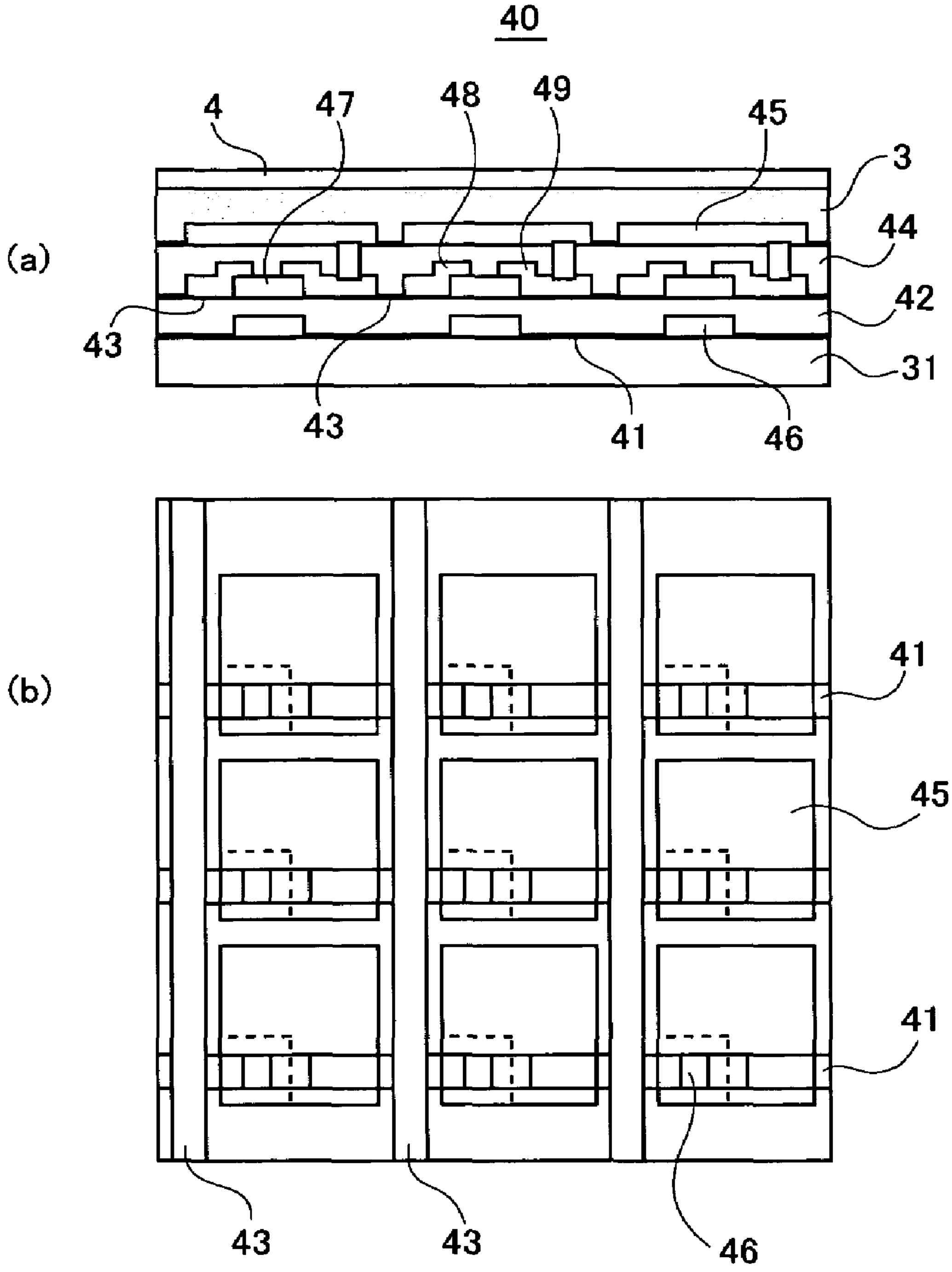
FIG. 4 shows the makeup of a solid state light-emissive display apparatus of the present invention by active driving, wherein (a) is a cross-sectional view, and (b) is a plan view.

FIG. 4 shows the makeup of a solid state light-emissive display apparatus of the present invention by active driving, wherein FIG. 4(*a*) is a cross-sectional view, and FIG. 4(*b*) is a plan view. A solid state light-emissive display apparatus 40 of the present invention comprises a plurality of the scanning wirings 41 in a form of mutually parallel stripes formed on a substrate 31, the first insulation layer 42 laminated on the substrate 31 having said scanning wirings 41 formed on the substrate, a plurality of the signal wirings 43 in a form of mutually parallel stripes formed on said first insulation layer 42 so to form a perpendicular matrix with said scanning wiring 41, the second insulation layer 44 laminated on said first insulation layer 42 having said signal wirings 43 formed on the first insulation layer 42, the pixel electrodes 45 formed on said second insulation layer 44 and in the proximity of matrix cross sectional region, the luminous thin film 3 laminated on said second insulation layer 44 having pixel electrodes 45 formed on the second insulation layer 44, and the transparent upper electrode 4 covering the whole display surface formed on said luminous thin film 3.

Near matrix cross sectional region and on said scanning wiring 41 is set a gate electrode 46 of a thin film transistor protruding into the first insulation layer 42, a channel semiconductor layer 47 of a thin film transistor is set opposing to said gate electrode 46 on the first insulation layer 42, one end of said channel 47 is connected to the signal wiring 43 via a drain electrode 48, and the other end of said channel 47 is connected to the pixel electrode 45 via a source electrode 49.

In accordance with the above mentioned, images and mobile images can be displayed. As a luminous thin film explained in FIGS. 1 and 2 is used in the present invention, a solid state light-emissive display apparatus of highly efficient and bright luminescence, thin type, and of high reliability can be provided. Also according to the present makeup, since the voltage ratio between a pixel electrode switched on by a thin film transistor and a pixel electrode switched off by a thin film transistor is large, the extinction ratio between pixels becomes high, and so high resolution display is made possible. High speed display is also possible because it can be driven with smaller power than by simple matrix system.

Explanation is next given in respect to the method of manufacture of a solid state light-emissive display apparatus of the present invention.

The method of manufacture is first explained in respect to the making of the single crystal fine particles coated with insulator consisting of Si single crystal fine particles coated with $SiO_2$ film.

Figure 5:
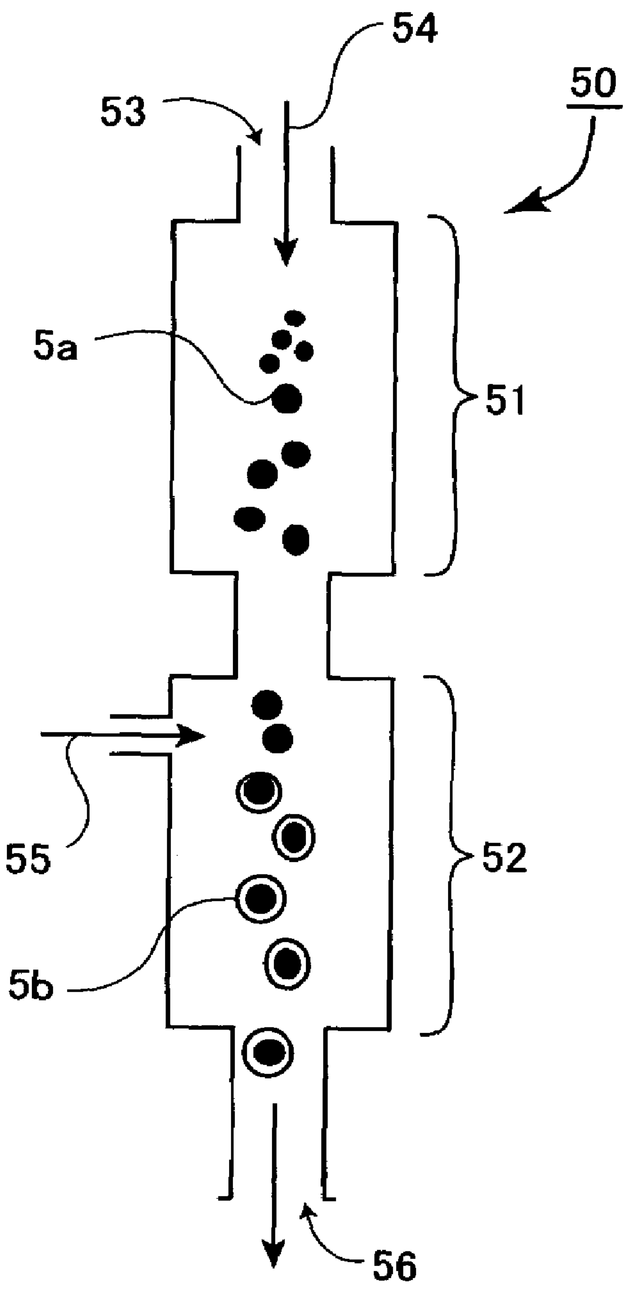
FIG. 5 is a drawing for explanation of the method of manufacture of $SiO_2$-coated Si single crystal fine particles in accordance with the present invention.

FIG. 5 is a drawing for explanation of the method of manufacturing of $SiO_2$-coated Si single crystal fine particles in accordance with the present invention. In this figure, the manufacturing apparatus 50 has open tube which consists of a part 51 for producing Si single crystal fine particles and a part 52 for coating single crystal fine particles with $SiO_2$ film, wherein $SiH_4$ (silane) gas 54 is made to flow into the tube from the inlet 53, $SiH_4$ gas 54 is pyrolized to form said Si single crystal fine particles 5*a* of nm size at the part 51 which is held at the pyrolysis temperature of $SiH_4$ 54, and Si single crystal fine particles produced are floating in the atmosphere. Si single crystal fine particles 5*a* thus produced are transferred into said part 52 by the gas flow, that is, by flowing gas, or by gravity, and $SiO_2$ film 5*b* of nm thickness is formed on the surface of Si single crystal fine particles 5*a* in the state of floating in the atmosphere by oxygen 55 introduced into a part 52. The $SiO_2$-coated Si single crystal fine particles 5 thus formed are transferred to the outlet 56 by flowing gas or by gravity and collected.

By the method mentioned above, it is possible to produce $SiO_2$-coated Si single crystal fine particles mutually separated without forming porous aggregate formed by mutual contact of said single crystal fine particles.

Explanation is next made in respect to the formation of luminous thin film by laminating of single crystal fine particles coated with insulator and fluorescent fine particles on a substrate.

Figure 6:
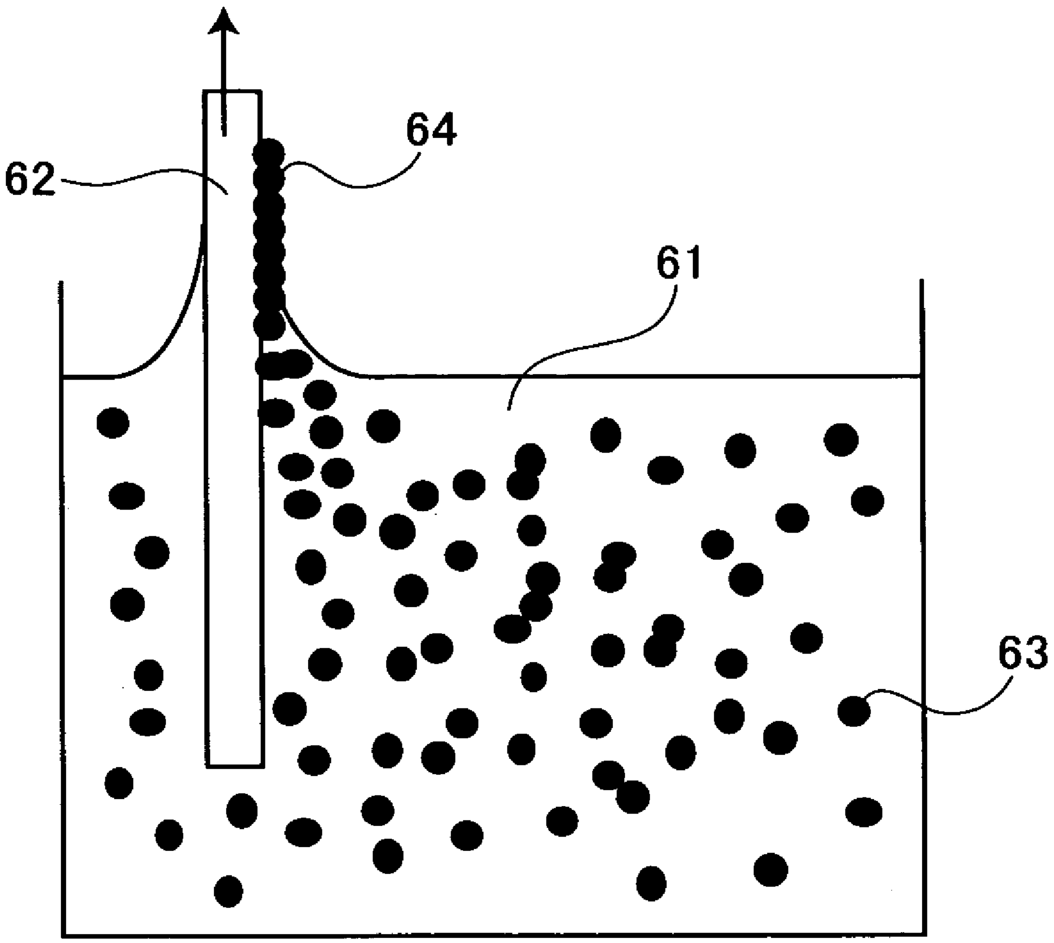
FIG. 6 is a drawing for explanation of the method of lamination of crystal fine particles coated with insulator and fluorescent fine particles in accordance with the present invention.

FIG. 6 is a drawing for explanation of the method of laminating of single crystal fine particles coated with insulator and fluorescent fine particles in accordance with the present invention.

The figure shows soaking the substrate 62 into the solvent 61 such as water and pulling up said substrate, wherein said substrate 62 has the lower electrodes 2 or the pixel electrodes 45 formed on it and in said solvent 61 single crystal fine particles coated with insulator 5 or fluorescent fine particles 7 are dissolved. The fine particles 63 which are single crystal fine particles coated with insulator 5 or fluorescent fine particles 7 in the solvent 61 are adhered to the substrate surface 62 so as to minimize the surface free energies such as the surface tension energy of the solvent 61, and the adsorption energy of fine particles 63 to the substrate 62, as the result, a mono layer 64 consisting of the fine particles 63 aligned mutually and densely on the substrate 62 is formed.

By the repeating of soaking and pulling up of the substrate 62, the fine particle layers 64 can be mutually and densely laminated to desired thickness corresponding to the repeating number.

In order to form the luminous thin film 3 of the makeup shown in FIG. 1(*a*), single crystal fine particles coated with insulator 5 and fluorescent fine particles 7 are dissolved individually in different solvents, and the above mentioned repeating process is repeated with one solvent to laminate to the desired thickness, followed by the repeating process with the other solvent to laminate to the desired thickness.

In order to form the luminous thin film 3 of the makeup shown in FIG. 1(*b*), single crystal fine particles coated with insulator 5 and fluorescent fine particles 7 are dissolved individually in different solvents, and the above mentioned repeating process is alternately repeated with each solvent to laminate the layer 6 of single crystal fine particles coated with insulator and the layer 8 of fluorescent fine particles alternately one by one.

In order to form the luminous thin film 3 of the makeup shown in FIG. 1(*c*), single crystal fine particles coated with insulator 5 and fluorescent fine particles 7 are dissolved in a common solvent, the above mentioned repeating process is repeated with the common solvent to laminate the mixed layer of crystal fine particles coated with insulator 5 and fluorescent fine particles 7 to the desired thickness.

Since fine particles are aligned densely with few gaps in the luminous thin film thus formed, the electric field distribution is uniform, tunneling probability increases, and electrons can be accelerated at high efficiency. Also, brightness is high because fluorescent fine particles are densely aligned.

INDUSTRIAL APPLICABILITY

As will have been appreciated from the foregoing description, the present invention provides a solid state light-emissive display apparatus of dramatically higher brightness and efficiency, higher reliability, and of thinner type than existing display apparatuses. Also in accordance with the present invention, this solid state light-emissive display apparatus can be manufactured at low cost. Thus, if the apparatus of the present invention is used as the display apparatus of mobile phones or others, it is quite useful because of much lower power consumption, higher brightness, thinner type, and higher reliability than existing liquid crystal displays.

What is claimed is:

1. A solid state light-emissive display apparatus, characterized in that it comprises:

a luminous part comprising a luminous thin film composed of laminated or mixed of crystal fine particles coated with insulator of nm (nanometer) size and fluorescent fine particles of nm size; and a lower electrode and a transparent upper electrode sandwiching said luminous thin film, whereby to obtain luminous display by impressing alternating voltage or direct current voltage between said upper and lower electrodes.

2. A solid state light-emissive display apparatus as set forth in claim 1, characterized in that:

said crystal fine particles coated with insulator of nm size consist of single crystal fine particle of nm size of either a semiconductor or a metal, and an insulator film of nm thickness coating the surface of said single crystal fine particle.

3. A solid state light-emissive display apparatus as set forth in claim 2, characterized in that:

said single crystal fine particles of nm size are either intrinsic Si single crystal fine particles of nm size or those doped with impurities, and said insulator film is $SiO_2$ film of nm thickness coating the surface of said Si single crystal fine particles.

4. A solid state light-emissive display apparatus as set forth in claim 1, characterized in that:

said fluorescent fine particles of nm size are the semiconductor fine particles having a band gap energy corresponding to an energy ranging from ultraviolet light to visible light.

5. A solid state light-emissive display apparatus as set forth in claim 4, characterized in that:

said fluorescent fine particles of nm size have either a donor or/and an acceptor.

6. A solid state light-emissive display apparatus as set forth in claim 4 or 5, characterized in that:

said fluorescent fine particles of nm size are the semiconductor fine particles involved with either a luminous atoms or a luminous atom ions.

7. A solid state light-emissive display apparatus as set forth in claim 1, characterized in that:

said upper and lower electrodes are formed in a form of matrix configuration, and intersection regions of said upper and lower electrodes are used as pixels which are driven by simple matrix driven operation.

8. A solid state light-emissive display apparatus as set forth in claim 1, characterized in that:

scanning wirings and signal wirings are formed in a form of matrix, a thin film transistor is set at an intersection region of said scanning wiring and said signal wiring, a gate electrode of said thin film transistor is connected to said scanning wiring, a drain electrode of said thin film transistor is connected to said signal wiring, a source electrode of said thin film transistor is connected to a pixel electrode, said luminous thin film is sandwiched by said pixel electrode and said upper electrode, whereby each said pixel is actively driven by said thin film transistors by choosing said scanning wiring and signal wiring.

9. A method of manufacturing of a solid state light-emissive apparatus, characterized in that it comprises steps:

producing Si single crystal fine particles of nm size by pyrolyzing $SiH_4$ in a floating state of said Si single crystal fine particles in atmosphere;

transferring said Si single crystal fine particles in the state of floating into $O_2$ gas atmosphere; and coating the surface of said Si single crystal fine particles with $SiO_2$ film of nm thickness.

10. A method of manufacturing of a solid state light-emissive apparatus, characterized in that it comprises steps:

dissolving crystal fine particles coated with insulator of nm size and fluorescent fine particles of nm size into respective solvents; and soaking a substrate into each solvent and pulling it up, whereby laminating of a single crystal fine particle layer and a fluorescent fine particle layer.

11. A method of manufacturing of a solid state light-emissive apparatus, characterized in that it comprises steps:

dissolving crystal fine particle coated with insulator of nm size and fluorescent fine particles of nm size into common solvent; and soaking a substrate into said solvent and pulling it up, whereby laminating a mixed layer composed of single crystal fine particles coated with insulator and fluorescent fine particles.

12. A method of manufacturing of a solid state light-emissive apparatus as set forth in claim 10 or 11, characterized in that:

said crystal fine particle coated with insulator of nm size consists of a single crystal fine particle of nm size of either a semiconductor or a metal, and an insulator film of nm thickness coating the surface of said single crystal fine particle.

13. A method of manufacturing of a solid state light-emissive apparatus as set forth in claim 12, characterized in that:

said single crystal fine particle of nm size is either intrinsic Si single crystal fine particle of nm size or that doped with impurity, and said insulator film is $SiO_2$ film of nm thickness coating the surface of said Si single crystal fine particle.

14. A method of manufacturing of a solid state light-emissive apparatus as set forth in claim 10 or 11, characterized in that:

said fluorescent fine particle of nm size is a semiconductor fine particle having a band gap energy corresponding to an energy ranging from ultraviolet light to visible light.

15. A method of manufacturing of a solid state light-emissive apparatus as set forth in claim 10 or 11, characterized in that:

said fluorescent fine particle of nm size has a donor or/and an acceptor.

16. A method of manufacturing of a solid state light-emissive apparatus as set forth in claim 14, characterized in that:

said fluorescent fine particle of nm size is a semiconductor fine particle involving a luminous atoms or a luminous atom ions.

* * * * *